(12) United States Patent
Xu

(10) Patent No.: US 8,080,459 B2
(45) Date of Patent: Dec. 20, 2011

(54) SELF ALIGNED CONTACT IN A SEMICONDUCTOR DEVICE AND METHOD OF FABRICATING THE SAME

(75) Inventor: Robert Q. Xu, Fremont, CA (US)

(73) Assignee: Vishay-Siliconix, Santa Clara, CA (US)

( * ) Notice: Subject to any disclaimer, the term of this patent is extended or adjusted under 35 U.S.C. 154(b) by 1164 days.

(21) Appl. No.: 10/869,382

(22) Filed: Jun. 15, 2004

(65) Prior Publication Data
US 2005/0224891 A1    Oct. 13, 2005

Related U.S. Application Data

(63) Continuation-in-part of application No. 10/524,385, filed on Sep. 24, 2002, and a continuation-in-part of application No. 10/378,766, filed on Mar. 3, 2003.

(51) Int. Cl.
*H01L 21/336* (2006.01)

(52) U.S. Cl. ........ 438/270; 438/259; 438/271; 438/299; 438/589; 257/330; 257/332; 257/382; 257/412; 257/E21.585; 257/E29.26; 257/E29.262

(58) Field of Classification Search .......... 257/382, 257/412, 330, 332, E21.585, E29.201, E29.154, 257/331, E29.257, E29.26, E29.262; 438/299, 438/589, 242, 246, 259, 280, 270, 271
See application file for complete search history.

(56) References Cited

U.S. PATENT DOCUMENTS

| 4,857,986 | A |   | 8/1989  | Kinugawa         |         |
|-----------|---|---|---------|------------------|---------|
| 4,939,557 | A |   | 7/1990  | Pao et al.       |         |
| 5,055,896 | A |   | 10/1991 | Williams et al.  |         |
| 5,072,266 | A | * | 12/1991 | Bulucea et al.   | 257/330 |
| 5,366,914 | A |   | 11/1994 | Takahashi et al. |         |
| 5,430,315 | A |   | 7/1995  | Rumennik         |         |
| 5,567,634 | A |   | 10/1996 | Hebert et al.    |         |
| 5,602,424 | A |   | 2/1997  | Tsubouchi et al. |         |

(Continued)

FOREIGN PATENT DOCUMENTS

EP    0354449    2/1990

(Continued)

OTHER PUBLICATIONS

"Effects on Selecting Channel Direction in Improving Performance of Sub-100 nm MOSFETs Fabricated on (110) Surface Si Substrate" Japanese Journal of Applied Physics, Part 1, vol. 43, No. 4B, Apr. 2004 pp. 1723-1728 (Nakamura et al.), XP00122768.

*Primary Examiner* — David S Blum
*Assistant Examiner* — Colleen E Snow

(57) ABSTRACT

A method of fabricating a self-aligned contact in a semiconductor device, in accordance with one embodiment of the present invention, includes etching a trench in a core area and partially extending into a termination area of a substrate. A first oxide is grown on the substrate proximate the trench. A polysilicon layer is deposited in the core area and the termination area. The polysilicon layer is selectively etched to form a gate region in the core area portion of the trench. The etching of the polysilicon layer also forms a first portion of a gate interconnect region in the termination area portion of the trench and a second portion in the termination area outside of the trench.

18 Claims, 14 Drawing Sheets

U.S. PATENT DOCUMENTS

| | | | |
|---|---|---|---|
| 5,648,283 A | 7/1997 | Tsang et al. | |
| 5,770,878 A | 6/1998 | Beasom | |
| 5,808,340 A | 9/1998 | Wollesen et al. | |
| 5,814,858 A | 9/1998 | Williams | |
| 5,965,904 A | 10/1999 | Ohtani et al. | |
| 6,153,896 A | 11/2000 | Omura et al. | |
| 6,168,996 B1* | 1/2001 | Numazawa et al. | 438/270 |
| 6,172,398 B1 | 1/2001 | Hshieh | |
| 6,180,966 B1 | 1/2001 | Kohno et al. | |
| 6,211,018 B1 | 4/2001 | Nam et al. | |
| 6,245,615 B1 | 6/2001 | Noble et al. | |
| 6,268,242 B1 | 7/2001 | Williams et al. | |
| 6,277,695 B1 | 8/2001 | Williams et al. | |
| 6,359,308 B1 | 3/2002 | Hijzen et al. | |
| 6,391,721 B2* | 5/2002 | Nakagawa | 438/259 |
| 6,413,822 B2 | 7/2002 | Williams et al. | |
| 6,483,171 B1 | 11/2002 | Forbes et al. | |
| 6,495,883 B2 | 12/2002 | Shibata et al. | |
| 6,580,154 B2 | 6/2003 | Noble et al. | |
| 6,642,109 B2* | 11/2003 | Lee et al. | 438/257 |
| 6,661,054 B1* | 12/2003 | Nakamura | 257/330 |
| 6,700,158 B1 | 3/2004 | Cao et al. | |
| 6,710,403 B2 | 3/2004 | Sapp | |
| 6,717,210 B2 | 4/2004 | Takano et al. | |
| 6,861,701 B2 | 3/2005 | Williams et al. | |
| 6,903,393 B2 | 6/2005 | Ohmi et al. | |
| 6,919,610 B2 | 7/2005 | Saitoh et al. | |
| 6,927,455 B2 | 8/2005 | Narazaki | |
| 6,960,821 B2 | 11/2005 | Noble et al. | |
| 7,361,952 B2 | 4/2008 | Miura et al. | |
| 7,521,306 B2 | 4/2009 | Kubo et al. | |
| 7,541,642 B2 | 6/2009 | Kawamura et al. | |
| 2001/0026006 A1 | 10/2001 | Noble et al. | |
| 2002/0074585 A1 | 6/2002 | Tsang et al. | |
| 2003/0030092 A1 | 2/2003 | Darwish et al. | |
| 2004/0155287 A1 | 8/2004 | Omura et al. | |
| 2004/0161886 A1 | 8/2004 | Forbes et al. | |
| 2005/0026369 A1 | 2/2005 | Noble et al. | |
| 2005/0079678 A1 | 4/2005 | Verma et al. | |
| 2006/0108635 A1 | 5/2006 | Bhalla et al. | |
| 2006/0113588 A1 | 6/2006 | Wu | |
| 2008/0099344 A9 | 5/2008 | Basol et al. | |

FOREIGN PATENT DOCUMENTS

| | | |
|---|---|---|
| EP | 0620588 | 10/1994 |
| EP | 0628337 | 12/1994 |
| EP | 1186023 | 3/2002 |
| EP | 1351313 | 10/2003 |
| EP | 1376674A2 A2 | 1/2004 |
| EP | 1403914 | 3/2004 |
| JP | H06-350090 | 12/1994 |
| JP | H09-129877 | 5/1997 |
| JP | 10-032331 | 2/1998 |
| JP | 2000091344 | 3/2000 |
| JP | 2001016080 | 1/2002 |
| JP | 2002110978 | 4/2002 |
| JP | 2002246596 | 8/2002 |
| JP | 20020016080 | 9/2002 |
| JP | 2004134793 | 4/2004 |
| WO | 0065646 | 11/2000 |
| WO | 0199177 | 12/2001 |
| WO | 20040105116 | 2/2004 |
| WO | 20060058210 | 1/2006 |

* cited by examiner

SELF ALIGNED CONTACT IN A SEMICONDUCTOR DEVICE AND METHOD OF FABRICATING THE SAME

CROSS-REFERENCE TO RELATED APPLICATIONS

This is a continuation-in-part of application Ser. No. 10/254,385 filed Sep. 24, 2002 and application Ser. No. 10/378,766 filed Mar. 3, 2003.

BACKGROUND OF THE INVENTION

As semiconductor fabrication technology continues to progress, devices such as trench metal-oxide-semiconductor field effect transistors (TMOSFET) continue to get smaller and less expensive. The design and layout for such devices are constrained by technology specific minimum sizes, spacings, alignments and overlaps of the various structures of the semiconductor device and the fabrication means.

Referring to FIG. 1, a block diagram of a trench metal-oxide-semiconductor field effect transistor (TMOSFET) according to the conventional art is shown. As depicted in FIG. 1, the substrate of the TMOSFET includes a core area 105 and a termination area 110. A polysilicon layer is deposited on the substrate 115 and fills a plurality of trenches therein. A trench mask and a selective etching process is utilized to pattern the polysilicon layer after it is deposited on the substrate such that a plurality of gates 120 are formed in the trenches. A portion of the polysilicon layer in the termination area 110 is protected by the trench mask such that a first portion of a gate interconnect 125 is formed. A thick oxide layer 130 is then deposited in the termination area 110 and patterned such that a gate interconnect opening is formed. Another polysilicon layer is deposited and patterned to form a second portion of the gate interconnect 125. Another thick oxide layer 135 is deposited and patterned, such that a gate contact opening is formed. A gate contact 140 extends down through the gate contact opening, such that the gate contact 140 is electrically coupled the gates 120 by the gate interconnect 125.

Referring now to FIG. 2, a block diagram of another TMOSFET according to the conventional art is shown. As depicted in FIG. 2, the substrate of the TMOSFET includes a core area 205 and a termination area 210. A gate bus trench in the termination area 210 is formed having a greater width than the gate trenches in the core area. The width of the gate bus trench is greater than gate trenches in the core area 205 to enable ready alignment of the gate contact opening with the gate bus trench. A polysilicon layer is deposited on the substrate and fills the plurality of gate trenches and the gate bus trench. A trench mask and a selective etching process is utilized to pattern the polysilicon layer after it is deposited on the substrate, such that a plurality of gates 215 are formed in the gate trenches and a gate bus 220 is formed in the gate bus trench. A thick oxide layer 225 is then deposited and patterned such that a gate contact opening is aligned with the gate bus trench. A gate contact 230 extends down through the gate contact opening such that the gate contact 230 is electrically coupled to the gates 215 by the gate bus 220.

The structure of the TMOSFET as shown in FIG. 1 suffers in that the topology of the surface contains large height variations. The photolithography process utilized to pattern the various layers is adversely effected by the large height variations. The photolithography process has a restricted depth of focus that adversely impacts resolution limit (e.g., minimum feature size) which can be achieved utilizing photolithography because the topography height variations. Although the structure of the TMOSFET as shown in FIG. 2 has a substantially planar topography, the minimum feature size of the device is deleteriously affected by alignment requirements. Even a small misalignment in the exposure tool may result in increased leakage current or even an electrical short between the gate and source electrodes. In addition the TMOSFET structure as shown in FIG. 2 does not readily facilitate the integration of termination structures, such as a temperature sensor, an electro-static protection diode, a field capacitor and/or the like, as the entire polysilicon layer from which such structures may be formed is etched away.

SUMMARY OF THE INVENTION

Accordingly, embodiments of the present invention are directed toward a novel self-aligned contact and a method of fabricating the self-aligned contact in a semiconductor device. In one embodiment, the method of fabricating a self-aligned contact includes etching a trench in a core area and partially extending into a termination area of a substrate. A first oxide is grown on the substrate proximate the trench. A polysilicon layer is deposited in the core area and the termination area. The polysilicon layer is selectively etched to form a gate region in the core area portion of the trench. The etching of the polysilicon layer also forms a first portion of a gate interconnect region in the termination area portion of the trench and a second portion in the termination area outside of the trench.

In another embodiment, a method of fabricating a trench metal-oxide-semiconductor field effect transistor having a self-aligned contact includes depositing a sacrificial oxide layer and a first nitride layer on a substrate. A trench is etched through the first nitride layer, sacrificial oxide layer and partially into the substrate. The trench is etched in a core area and partially extends into a termination area. A first portion of a gate insulator region is grown on the substrate proximate the trench such that a first portion of a gate insulator region is formed. A polysilicon layer is etching-back to form a gate region in the core area portion of the trench and to form a gate interconnect region in the termination area. A dielectric layer is deposited on the gate region, the gate interconnect region and the exposed portion of the first nitride layer. A second portion of the gate insulator region is formed about the gate region and the gate interconnect region, by etching-back the dielectric layer. The first nitride layer in the core area is removed to implant a body region and a source region. The upper portion of said substrate disposed proximate to the gate region is planted to form the body region, such that a drain region is formed in a lower portion of the substrate. Implanting the body region proximate the gate region forms the source region, such that the source region is separated from the drain region by the body region.

In another embodiment, a trench metal-oxide-semiconductor field effect transistor (TMOSFET) includes a self-aligned contact. The TMOSFET includes a substrate having a core area and a termination area. A drain region is disposed in a lower portion of the substrate. A trench is disposed in the core area and extends into a portion of the termination area. A polysilicon layer is disposed in the trench and extends into the termination area, such that a first portion of the polysilicon layer in the core area forms a gate region and a second portion of the polysilicon layer in the termination area forms a gate interconnect region. A gate insulator region is disposed about the polysilicon layer. A body region is disposed in the substrate proximate the trench and above the drain region. A source region is disposed in the body region proximate the trench and separated from the drain region by the body region. A source/body contact is coupled to the source region and the body region. A gate contact is coupled to the polysilicon layer in the termination area outside of the trench.

Embodiments of the present invention provide a fabrication process that is not limited by the topography of the termination area. The polysilicon layer utilized to form the gate regions is also advantageously utilized to form a self-aligned gate interconnect region in the periphery region. The self-aligned gate interconnect region enables the use of gate trenches having minimum feature size. The gate regions and the gate interconnect region are also advantageously formed without the use of one or more chemical-mechanical polishing processes. Periphery structures such as EDS diodes, temperature cells, field capacitors and the like may be readily integrated into the polysilicon layer utilized to form the gate region. Furthermore, the gate contact opening is self-aligned with the source and body regions.

BRIEF DESCRIPTION OF THE DRAWINGS

Embodiments of the present invention are illustrated by way of example and not by way of limitation, in the figures of the accompanying drawings and in which like reference numerals refer to similar elements and in which.

DETAILED DESCRIPTION OF THE INVENTION

Reference will now be made in detail to the embodiments of the invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present invention, numerous specific details are set forth in order to provide a thorough understanding of the present invention. However, it is understood that the present invention may be practiced without these specific details. In other instances, well-known methods, procedures, components, and circuits have not been described in detail as not to unnecessarily obscure aspects of the present invention.

Figure 1:
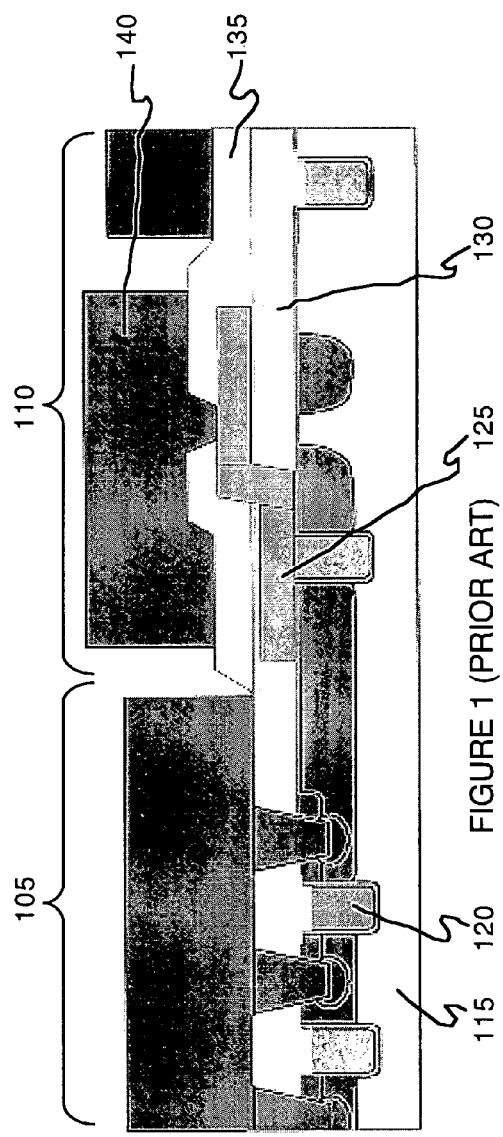
FIG. 1 shows a block diagram of a trench metal-oxide-semiconductor field effect transistor (TMOSFET) according to the conventional art.
Figure 2:
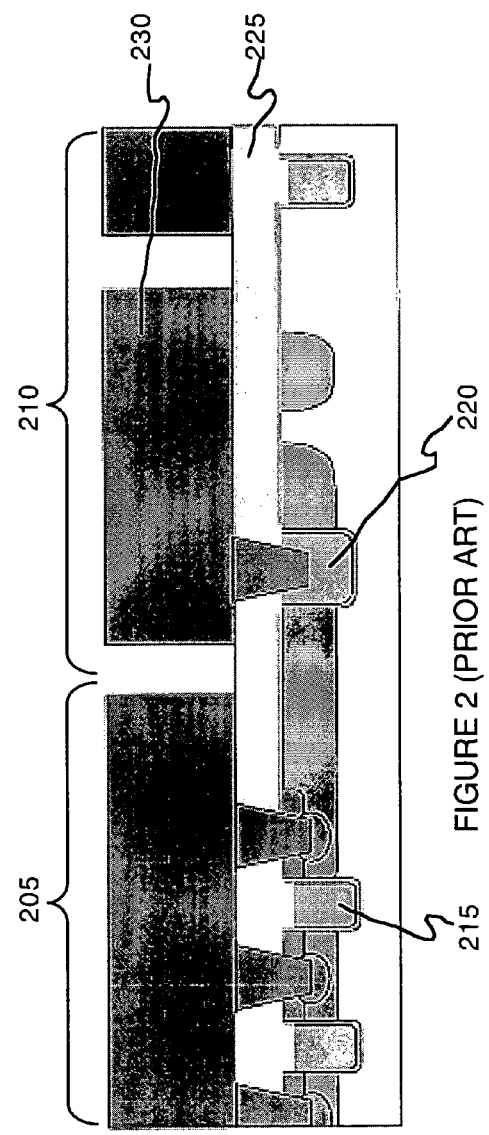
FIG. 2 shows a block diagram of another TMOSFET according to the conventional art.
Figure 3:
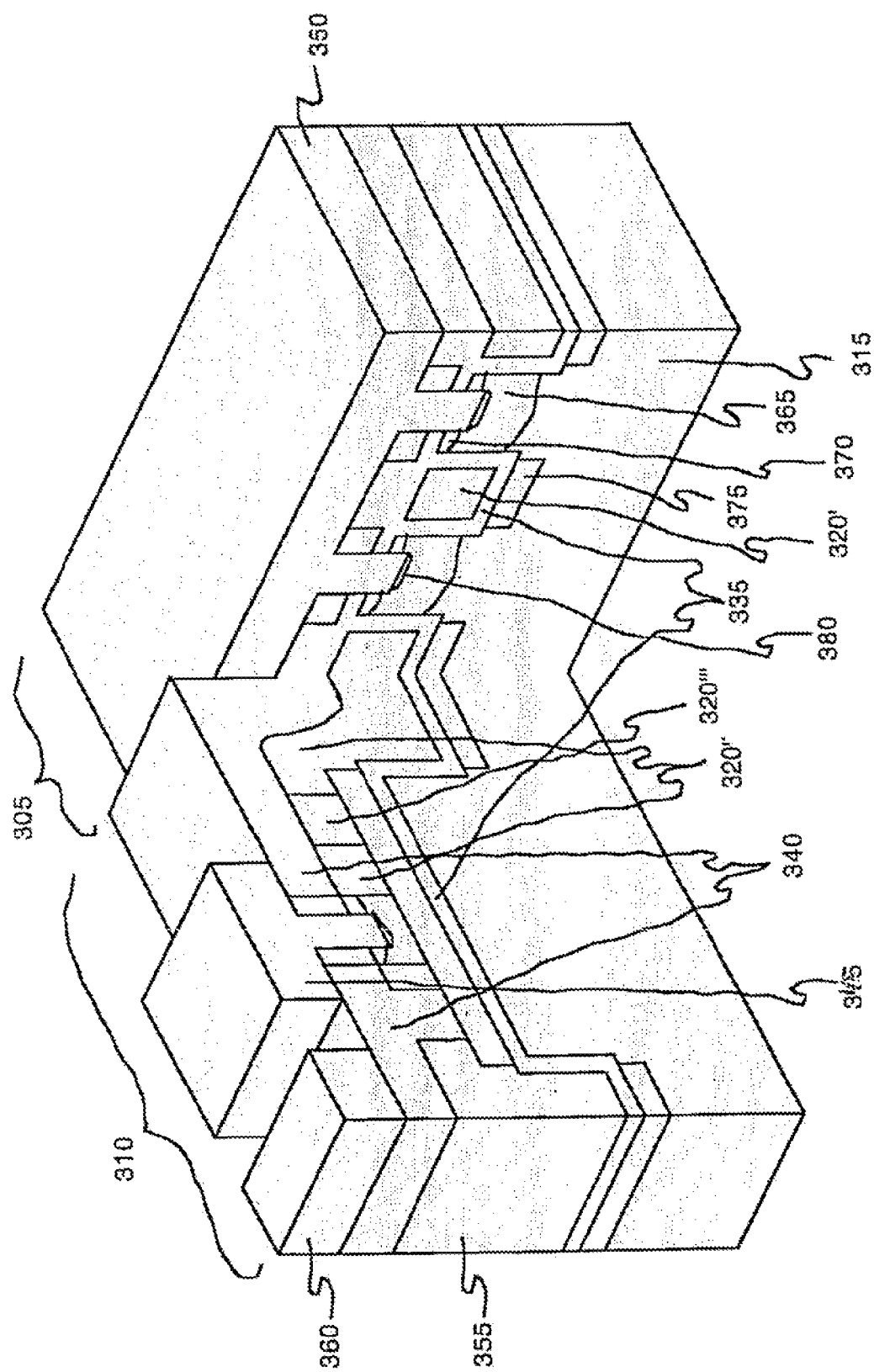
FIG. 3 shows a sectional perspective view of a TMOSFET, in accordance with one embodiment of the present invention.

Referring now to FIG. 3, a sectional perspective view of a trench metal-oxide-semiconductor field effect transistor (TMOSFET), in accordance with one embodiment of the present invention, is shown. As depicted in FIG. 3, TMOSFET includes a substrate having a core area 305 and a termination area 310. It is appreciated that the front corner is cutaway to show the core and termination areas in greater detail.

A drain region 315 may be disposed in a bottom portion of the substrate. One or more trenches are disposed in the core area 305 and extend into a portion of the termination 310. A patterned polysilicon layer may be disposed in the trenches and extends into the termination area outside the trenches. A first portion of said polysilicon layer in the core area 305 forms a gate region 320' and a second portion of the polysilicon layer in the termination area 310 forms a gate interconnect region 320". Hence, the gate region 320' and the gate interconnect region 320" are formed from the same polysilicon layer. Thus, the gate region 320' is self-aligned with the gate interconnect region 320" in the periphery region.

Optionally, a portion of the polysilicon layer in the termination area may be selectively implanted to form a diode 320'" in line with the gate interconnect region 320". The diode 320'" may be adapted to protect one or more regions of the TMOSFET (e.g., gate oxide) from damage due to electrostatic discharge. Hence, the diode 320'" is also formed from the same polysilicon layer as the gate region 320' and the gate interconnect region 320".

The gate region 320' is electrically isolated from the surrounding regions (e.g., drain region, source regions, body regions, source/body contact, gate contact and periphery structures) by a one or more dielectric layers 335, 340 that may be formed about the polysilicon layer. In one implementation, a first dielectric layer 335 (e.g., thermal oxide) is disposed between the polysilicon layer and the substrate. A second dielectric layer 340 (e.g., spin-on glass) is disposed between the polysilicon layer and the source/body contact 345, gate contact 350 and periphery structures such as temperature cell (not shown) or field capacitor 355, 360.

One or more body 365 regions may be formed in the substrate proximate the trench and above the drain region 315. One or more source regions 370 may be formed in the body region 365 proximate the trenches. The source regions 370 are separated from the drain region 315 by the body regions 365. A source/body contact 350 may be coupled to the source regions 370 and the body regions 365 through source/body contact openings. A gate contact 345 may be coupled to the gate interconnect region 320" (e.g., a portion of polysilicon layer in the termination area outside of the trenches).

In one implementation, the drain region 315 may be a semiconductor material doped with a first type of impurity, such as phosphorous or arsenic. The body regions 365 may be a semiconductor material doped with a second type of impurity, such as boron. The source regions 370 may be a semiconductor material doped with the first type of impurity. The TMOSFET may further include doped regions 375 in the drain region 315 proximate the bottoms of the trenches. The doped regions 375 proximate the trench bottoms may be heavily doped with the first type of impurity. The TMOSFET may also include doped regions 380 in the body region 365 proximate the bottoms of the source/body contact openings. The doped regions 380 proximate the source/body contact openings may be heavily doped with the second type of impurity.

Figure 4A:
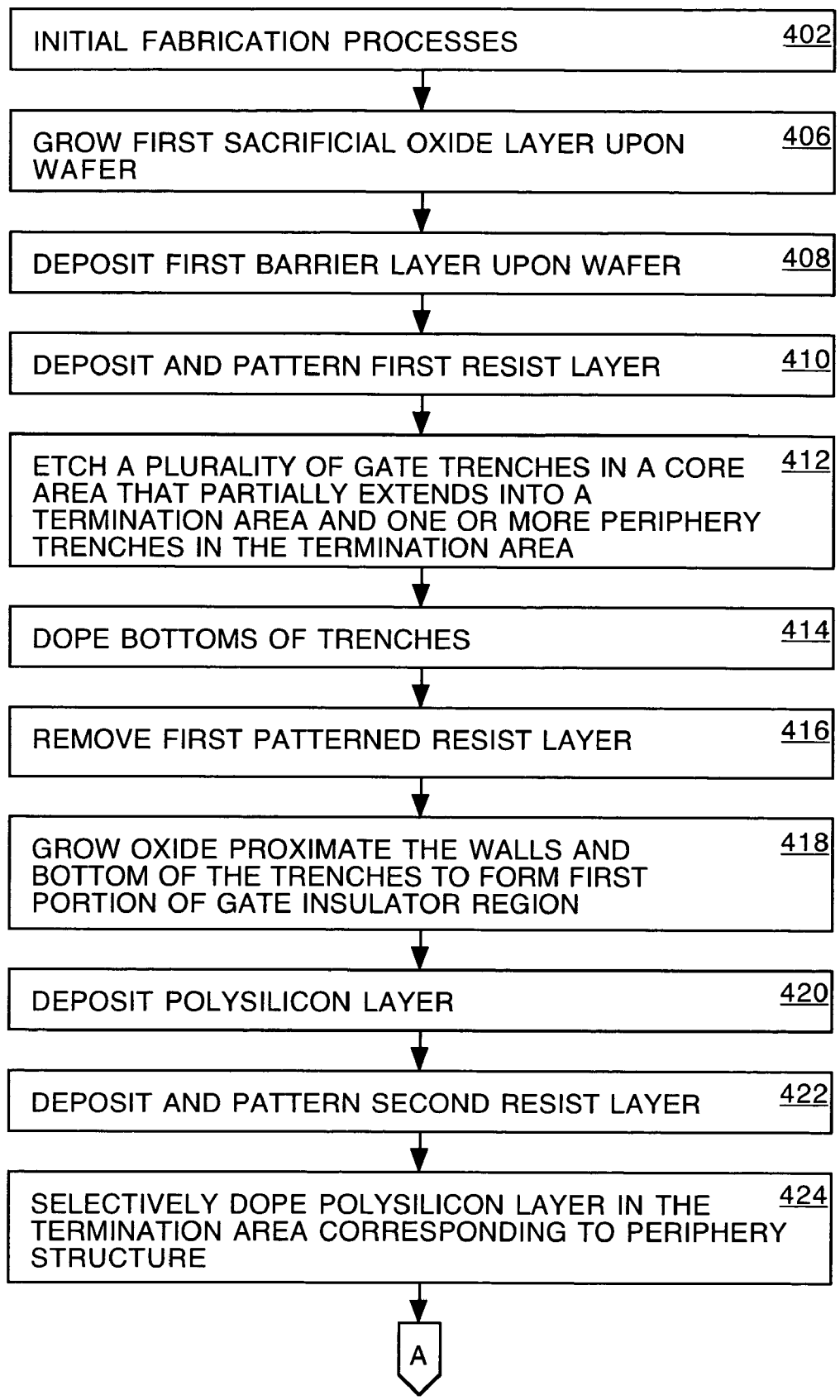
FIGS. 4A, 4B, 4C show steps of a flow diagram of an exemplary method of fabricating a TMOSFET, in accordance with one embodiment of the present invention.
Figure 4B:
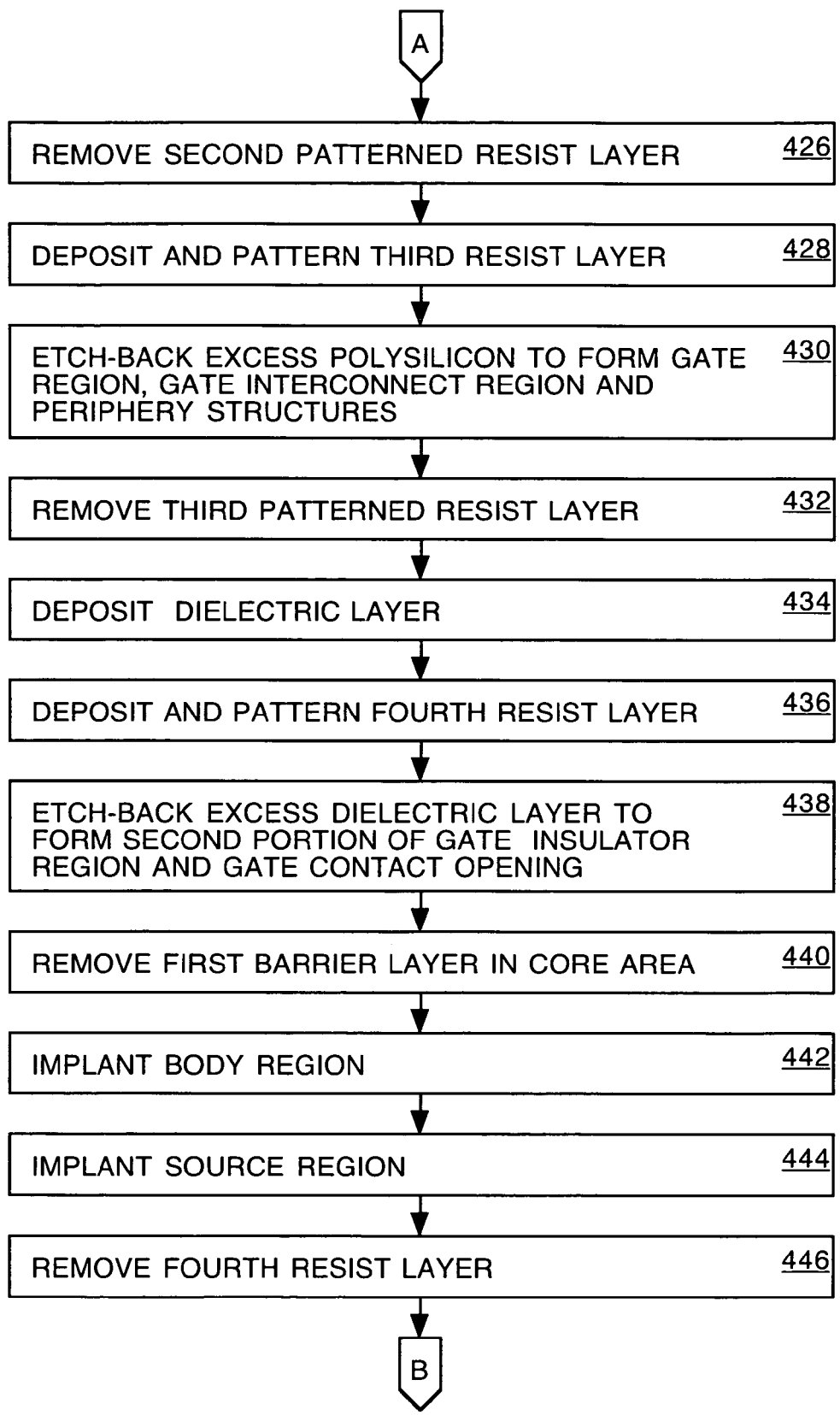
Figure 4C:
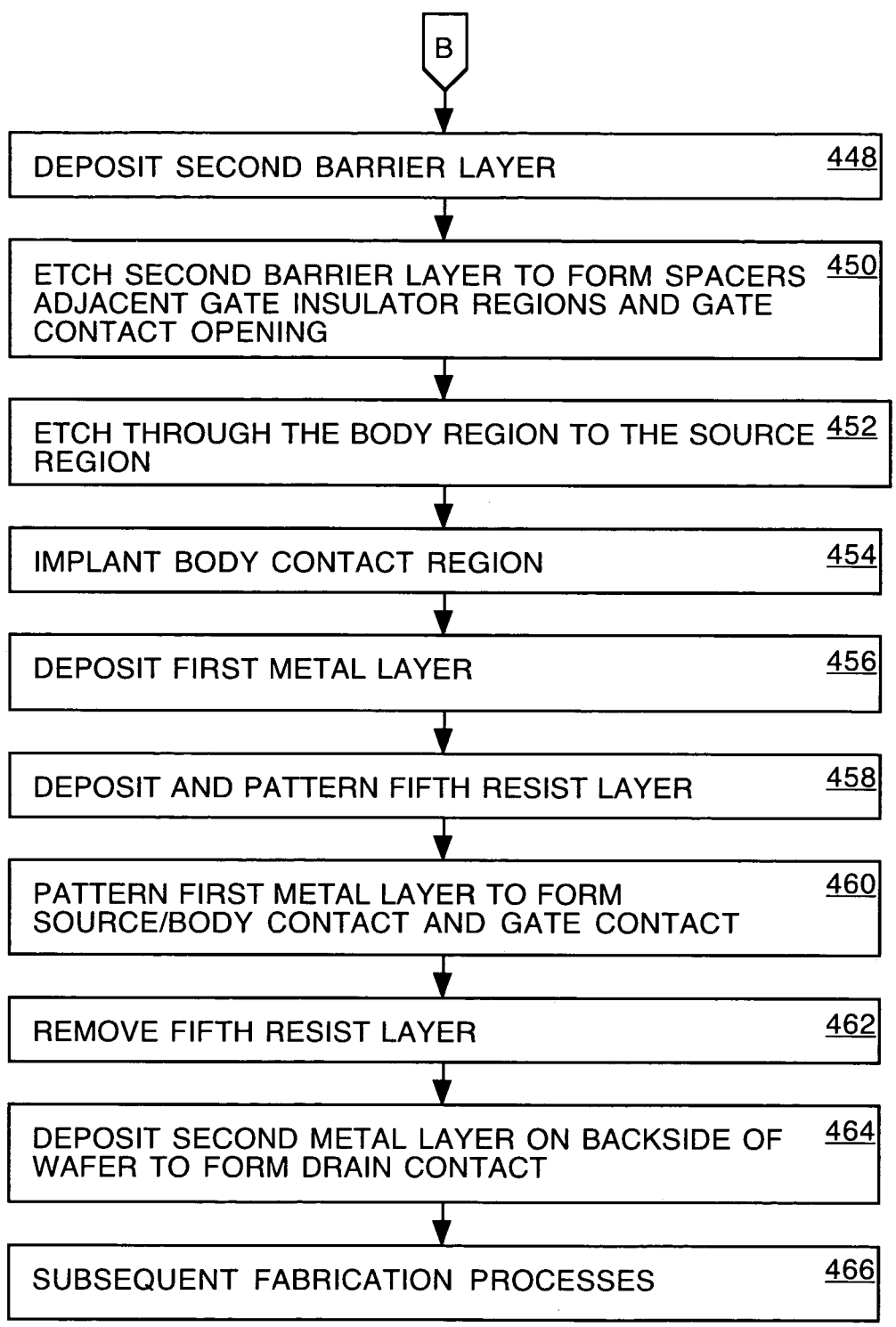
Figure 5A:
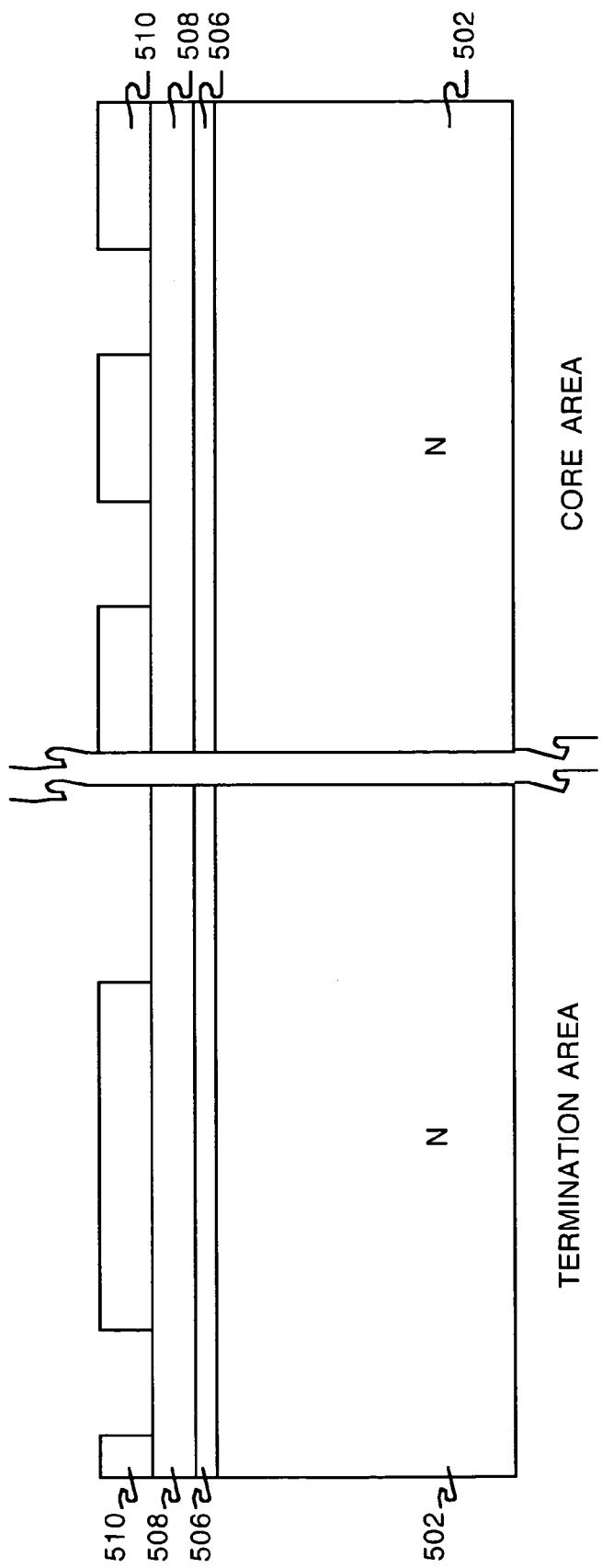
FIGS. 5A, 5B, 5C, 5D, 5E, 5F, 5G, 5H and 5I show a semiconductor device resultant from step of an exemplary method of fabricating a TMOSFET, in accordance with one embodiment of the present invention.

Referring now to FIGS. 4A-4C, a flow diagram of an exemplary process of fabricating a trench metal-oxide-semiconductor field effect transistor (TMOSFET), in accordance with one embodiment of the present invention, is shown. The process of fabricating the TMOSFET is illustrated in FIGS. 5A-5I. As depicted in FIGS. 4A and 5A, the fabrication process begins, at 402, with various initial processing upon a wafer 502 (e.g., substrate), such as cleaning, depositing, doping, etching and/or the like. The substrate 502 may be a semiconductor material having a first type of doping. In one implementation, the substrate 502 may be silicon doped with phosphorous or arsenic (N). After subsequent process steps, a lower portion of the substrate 502 may form a drain region.

Optionally (not shown), a portion of the substrate 502 may be doped to form a well region. In another optional process (not shown), a semiconductor layer may be epitaxial deposited upon the wafer 502. The epitaxial deposited semiconductor layer may for a drift region composed of a semiconductor doped with the first type impurity at a reduced concentration as compared to the drain region.

At 406, a first sacrificial oxide layer 506 may be formed upon the wafer 502. In one implementation, the first sacrificial oxide layer 506 is formed by oxidizing the surface of the wafer 502. At 408, a first barrier layer 508 may be deposited upon the first sacrificial oxide layer 506. At 410, a photo-resist may be deposited and pattered by any well-known lithography process to form a first patterned resist layer 510. The first patterned resist layer 510 defines a plurality of gate trenches and one or more periphery trenches.

Figure 5B:
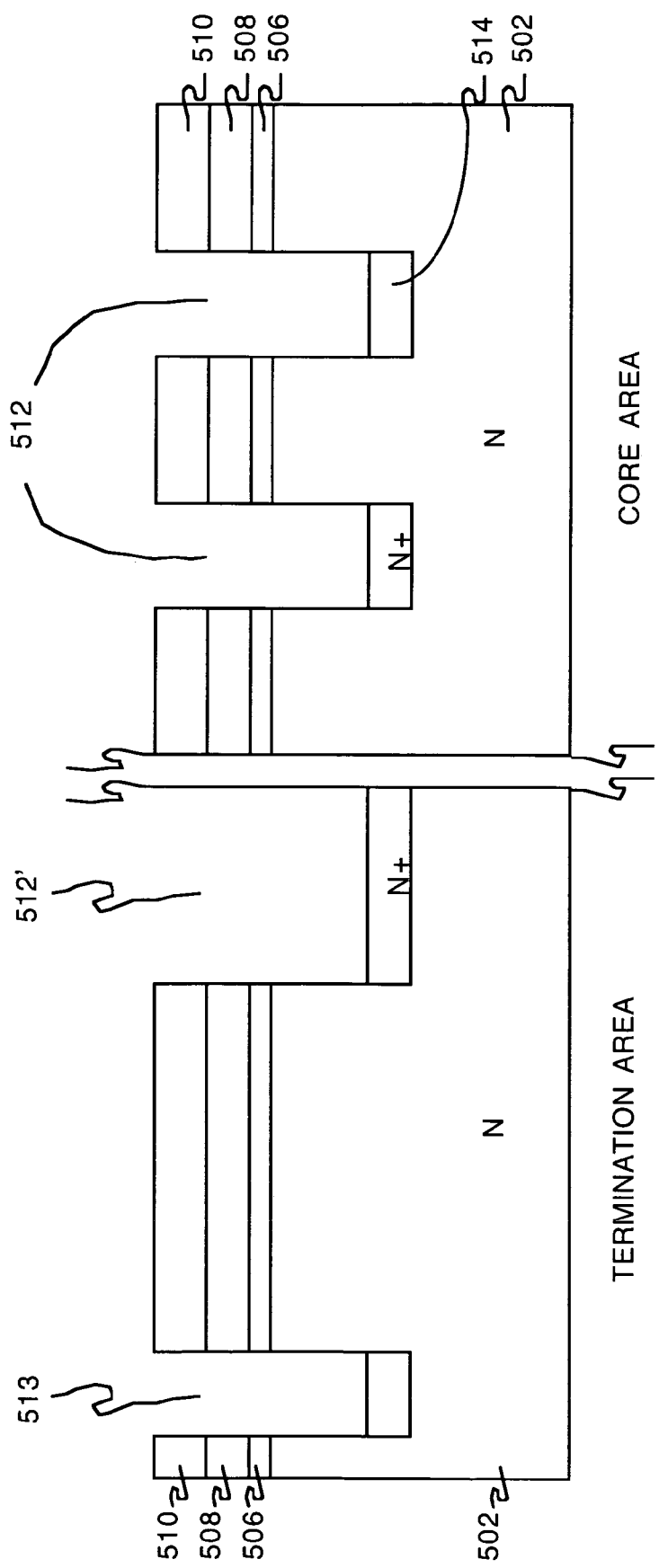

As depicted in FIG. 5B, the first barrier layer 508, the first sacrificial oxide layer 506 and a portion of the substrate 502 exposed by the first patterned resist layer 510 may be etched by any well-known anisotropic etching method (e.g., dry etch), at 412. In one implementation, a plurality of substantially parallel gate trenches 512 are formed in a core area. A portion of the gate trenches 512' extend into the termination area. One or more periphery trenches 513 may also be formed in a termination area.

At optional process 414, a trench bottom doping may be performed in the plurality of trenches 512, 513 of the core area and the termination area. An impurity of the first type may be implanted by any well-known method to form implant regions 514 proximate the bottoms of the trenches 512, 513. In one implementation, an n-type impurity, such as phosphorous or arsenic, is selectively implanted utilizing an ion-implant process. The doping process results in the formation of n-doped implant regions 514 having a relatively high concentration as compared to the substrate 502.

Figure 5C:
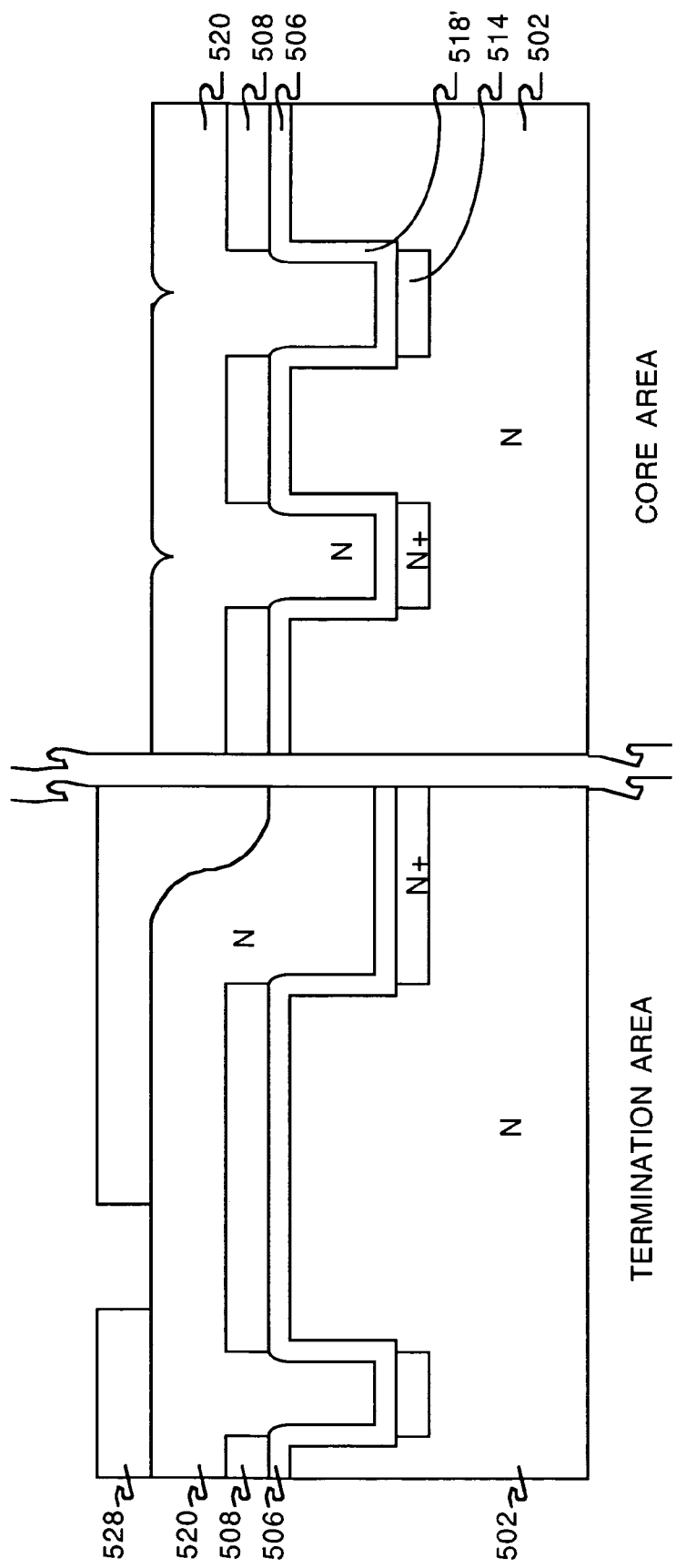

As depicted in FIG. 5C, the first patterned resist layer 510 may be removed utilizing an appropriate resist stripper or resist ashing process, at 416. At 418, a dielectric layer may be formed on the walls and bottoms of the trenches 512, 513. In one implementation, the dielectric layer is grown by oxidizing the surface of the silicon proximate the trenches 512, 513 to form a silicon dioxide layer. The resulting dielectric along the walls and bottoms of the gate trenches 512 form a first portion of a gate insulator region 518'.

At 420, a polysilicon layer 520 may be deposited on the wafer. The polysilicon layer 520 fills the trenches 512, 512 in the core area and the termination area. In one implementation, the polysilicon is deposited in the trenches by a method such as decomposition of silane ($SiH_4$). The polysilicon may be doped with n-type impurity, such as phosphorous or arsenic, by introducing the impurity during the decomposition process.

At optional process 422 (not shown in FIG. 5C), a photo-resist may be deposited and patterned by any well-known lithography process to form a second patterned resist layer. The second patterned resist layer may define one or more doping regions in the termination area for forming one or more periphery structures (e.g., temperature sensor, electro-static protection diode, field capacitor and/or the like). At optional process 424, the portions of the polysilicon layer in the termination area exposed by the second patterned resist layer may be doped with an impurity of a type opposite the doping of the polysilicon layer when deposited. At optional process 426, the second patterned resist layer may be removed utilizing an appropriate resist stripper or resist ashing process, as depicted in FIG. 4B.

At 428, a photo-resist may be deposited and patterned by any well-known lithography process to form a third patterned resist layer 528. The third patterned resist layer 528 defines a gate interconnect region and one or more termination structures (e.g., temperature sensor, electro-static protection diode, field capacitor and/or the like) in the termination area and exposes the active area.

Figure 5D:
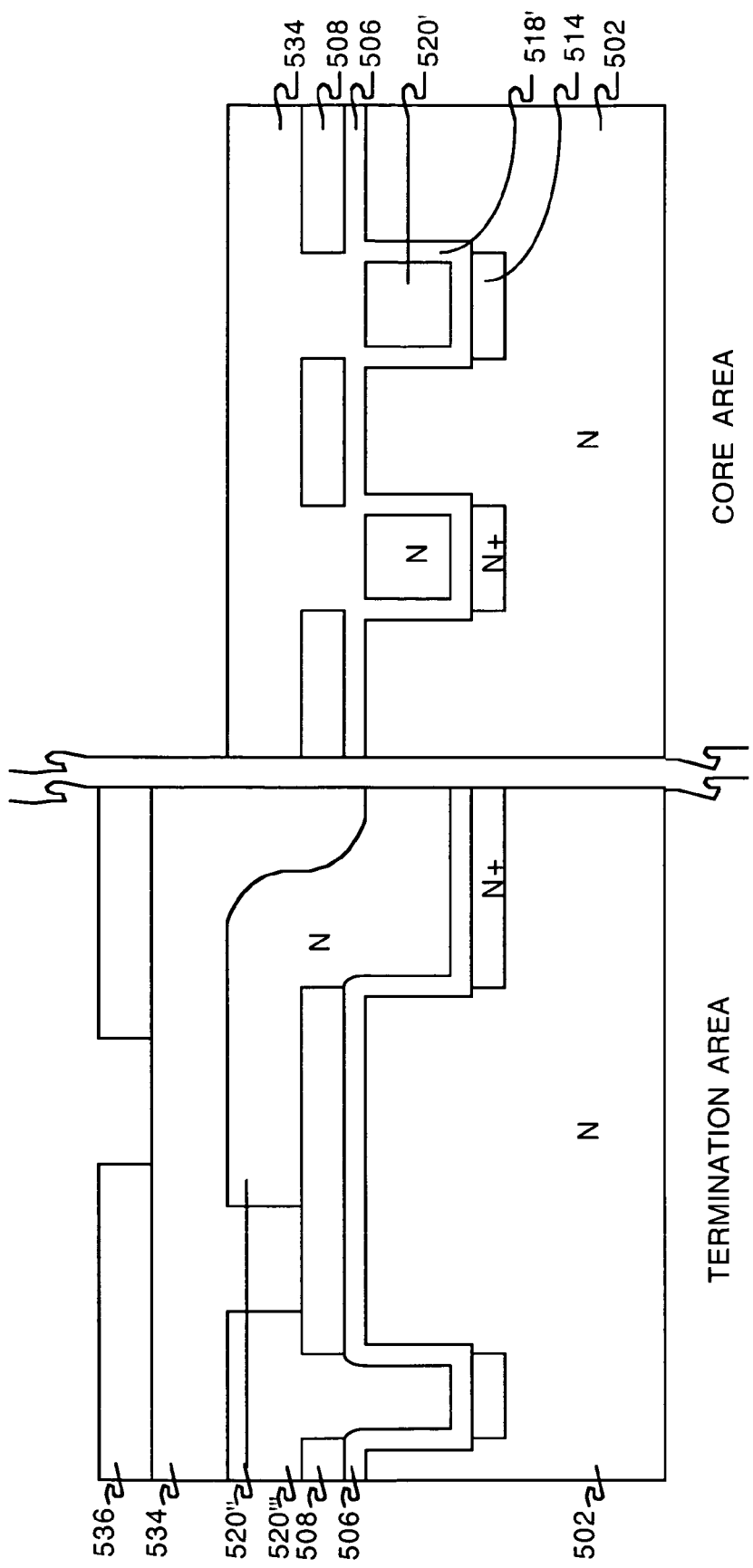

As depicted in FIG. 5D, a first etch-back process may be performed to remove excess polysilicon in the active area, at 430. The first etch-back process may also remove polysilicon in the termination area exposed by the third patterned resist layer 528. In one implementation, the polysilicon layer 520 is selectively removed by any well-known etching process (e.g., dry etching, reactive ion etching or the like). The first etch-back process may be performed until the polysilicon 520 in the active area is slightly recessed in the gate trenches 512. The resultant polysilicon in the gate trenches 512 form gate regions 520'. The first etch-back process may also pattern the polysilicon 520 in the termination area to form a gate interconnect region 520" and one or more periphery structures 520'". Accordingly, the polysilicon layer 520 utilized to form the gate regions 520' is self-aligned to the gate interconnect region 520".

In one implementation, the gate interconnect region 520' is formed in the portion of the gate trench extending into the termination area 512' and a portion of the termination area outside of the gate trench. In one implementation, the polysilicon layer 520 in the termination area is etched to form a first electrode 520" of a field capacitor. Other exemplary periphery structures may include a temperature sensor (e.g., diode, resistor), an electro-static discharge protection circuit (e.g., diode) and/or the like.

At 432, the third patterned resist layer may be removed utilizing an appropriate resist stripper or resist ashing process. At 434, a dielectric layer 534 may be formed on the surface of the wafer. In one implementation, a flowable oxide is deposited on the wafer. In another implementation, a spin-on glass (e.g., BPSG, etc.) is deposited on the wafer. In yet another implementation, the exposed polysilicon 520 is oxidized to form the dielectric layer 534. If the dielectric layer 534 is formed by oxidizing the exposed polysilicon 520, the first etch-back process may be reduced. It is appreciated that the amount of etch-back may be reduced because oxidation causes the dielectric layer to be formed approximately 50% above and below the surface of the polysilicon layer. At 436, a photo-resist may be deposited and pattered by any well-known lithography process to form a fourth patterned resist layer 536. The fourth patterned resist layer 536 defines one or more openings in the termination area and exposes the active area.

Figure 5E:
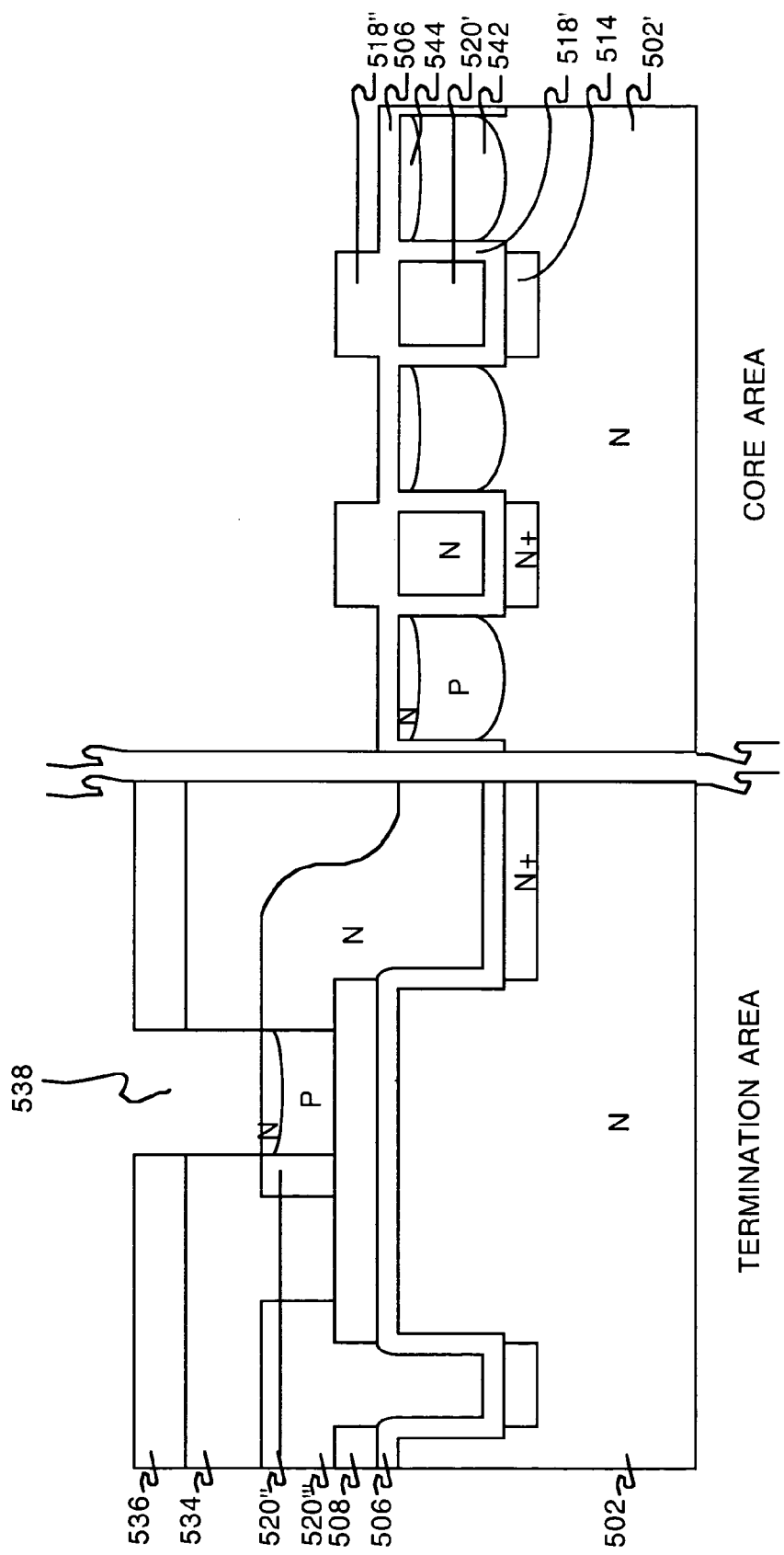

As depicted in FIG. 5E, a second etch-back process may be performed to remove excess dielectric material on the surface of the wafer, at 438. The etch-back process forms a second portion of the gate insulator region 518", thereby completing formation of the gate insulator region. The etch-back process may also form an initial gate contact opening 538 in the termination area that extends through the dielectric layer 534 down to the gate interconnect 520". From the following description it will be appreciated that the gate contact opening is self-aligned with the source and body regions.

At 440, the first barrier layer 508 in the core area may be removed. In one implementation, the first barrier layer is removed utilizing any well-known wet etching process that selectively etches the nitride barrier layer, without substantially etching the dielectric layer, polysilicon layer and sacrificial oxide layer.

At 442, the portions of the wafer exposed by the fourth patterned resist layer 536 may be doped with a second type of impurity to form body regions 542. In one implementation, the doping process selectively implants a p-type impurity, such as boron, in a portion of the substrate 502 in the core area. The doping process may also selectively implant the p-type impurity in the gate interconnect 520" exposed by the gate contact opening 538. A high temperature thermal cycle (e.g., rapid thermal anneal) may be utilized to drive in the body region 542 doping to a desired depth. It is appreciated that the lower portion of substrate 502 forms an n-doped drain region 502'.

At 444, the portions of the wafer exposed by the fourth patterned resist layer 536 may be doped with the first type of impurity to form source regions 544. In one implementation, the doping process implants an n-type impurity, such as phosphorous or arsenic, in the surface portion of the body region 542 and the portion of the gate interconnect region 520' exposed by the gate contact opening 538. A high temperature thermal cycle may be utilized to drive in the source region 544 doping to a desired depth. At 446, the fourth patterned resist layer 536 may be removed utilizing an appropriate resist stripper or resist ashing process.

Figure 5F:
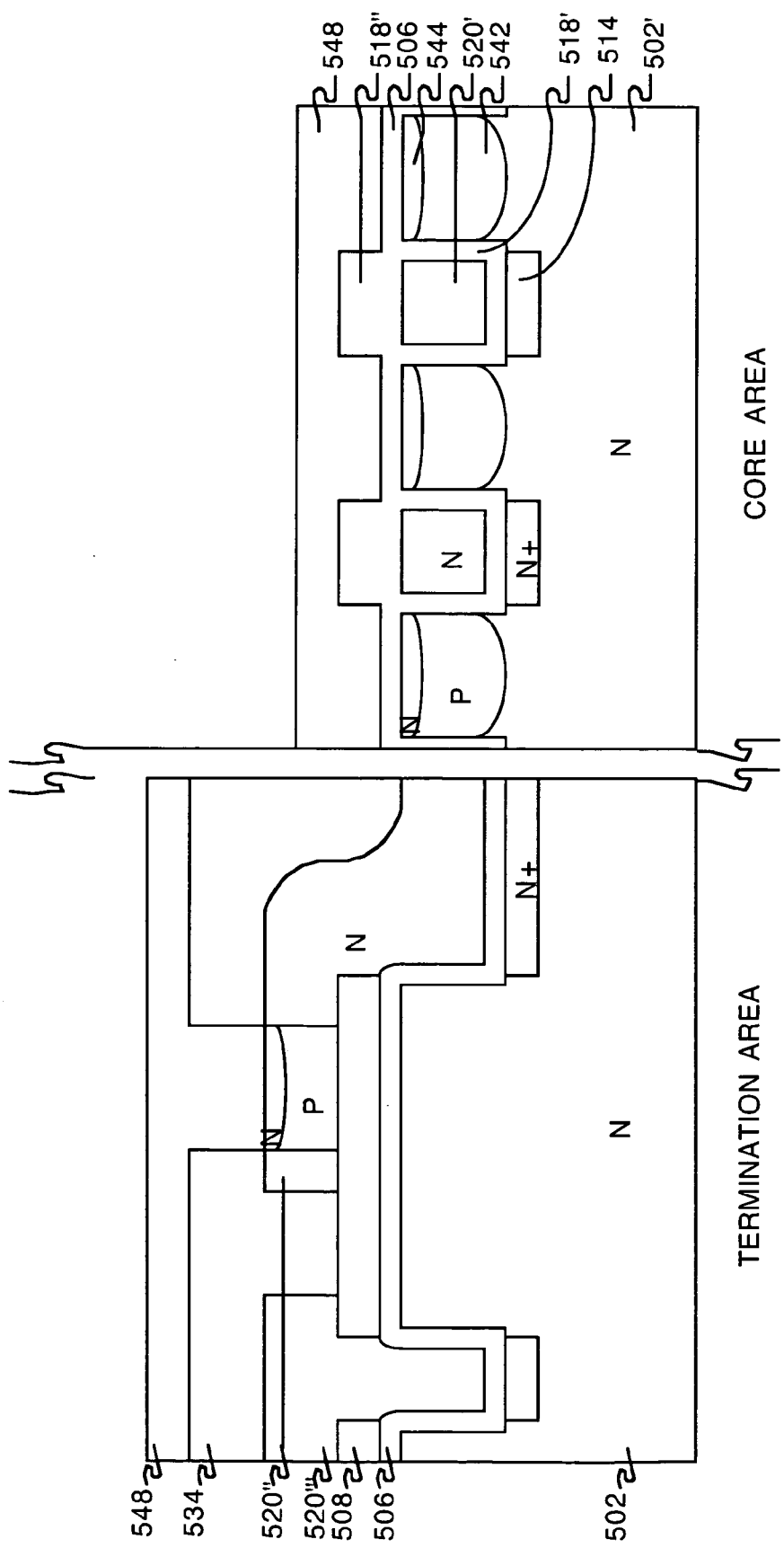
Figure 5G:
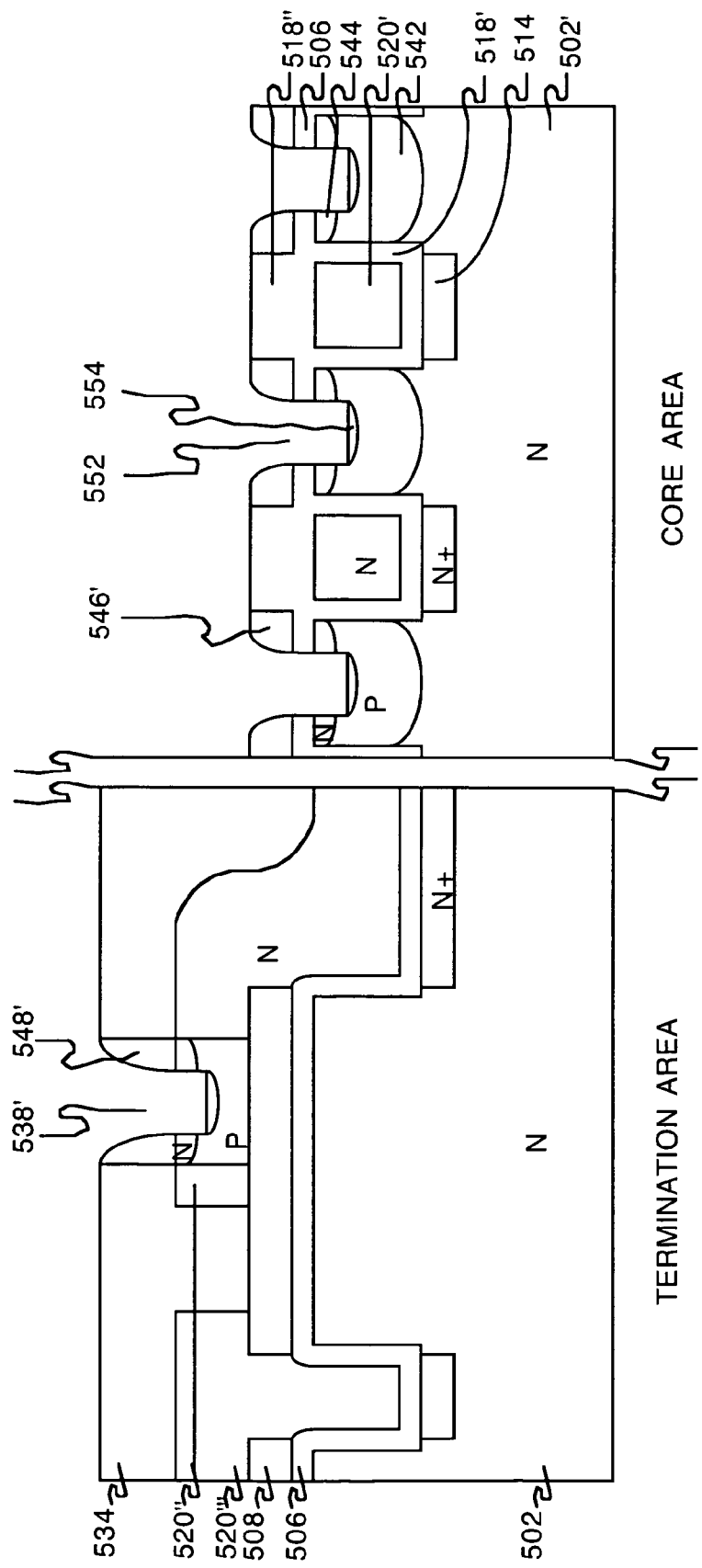

As depicted in FIGS. 4C and 5F, a second barrier layer 548 may be deposited upon the wafer, at 448. As depicted in FIG. 5G, the nitride layer 548 is etched to form nitride spacers proximate the second portion of the gate insulator regions 518" and in the gate contact opening 538, at 450. At 452, the portions of the source regions and the gate interconnect region exposed by the nitride spacers 546' may be etched by any well-known anisotropic etching method (e.g., dry etch), which selectively etches silicon without substantially etching nitride. The etching process is performed until source/body contact openings 552 partially extend into the body region 542. In addition, the gate contact opening 538' may extend partially into the gate interconnect region 520".

At 454, the portion of the body region 542 and gate interconnect 520" exposed by the nitride spacers 548' may be doped with the second type of impurity. The doping process results in the formation of body contact implant regions 554 proximate the source/body contact openings 552. In one implementation, the doping process implants a p-type impurity, such as boron, in the exposed portion of the body regions 542.

Figure 5H:
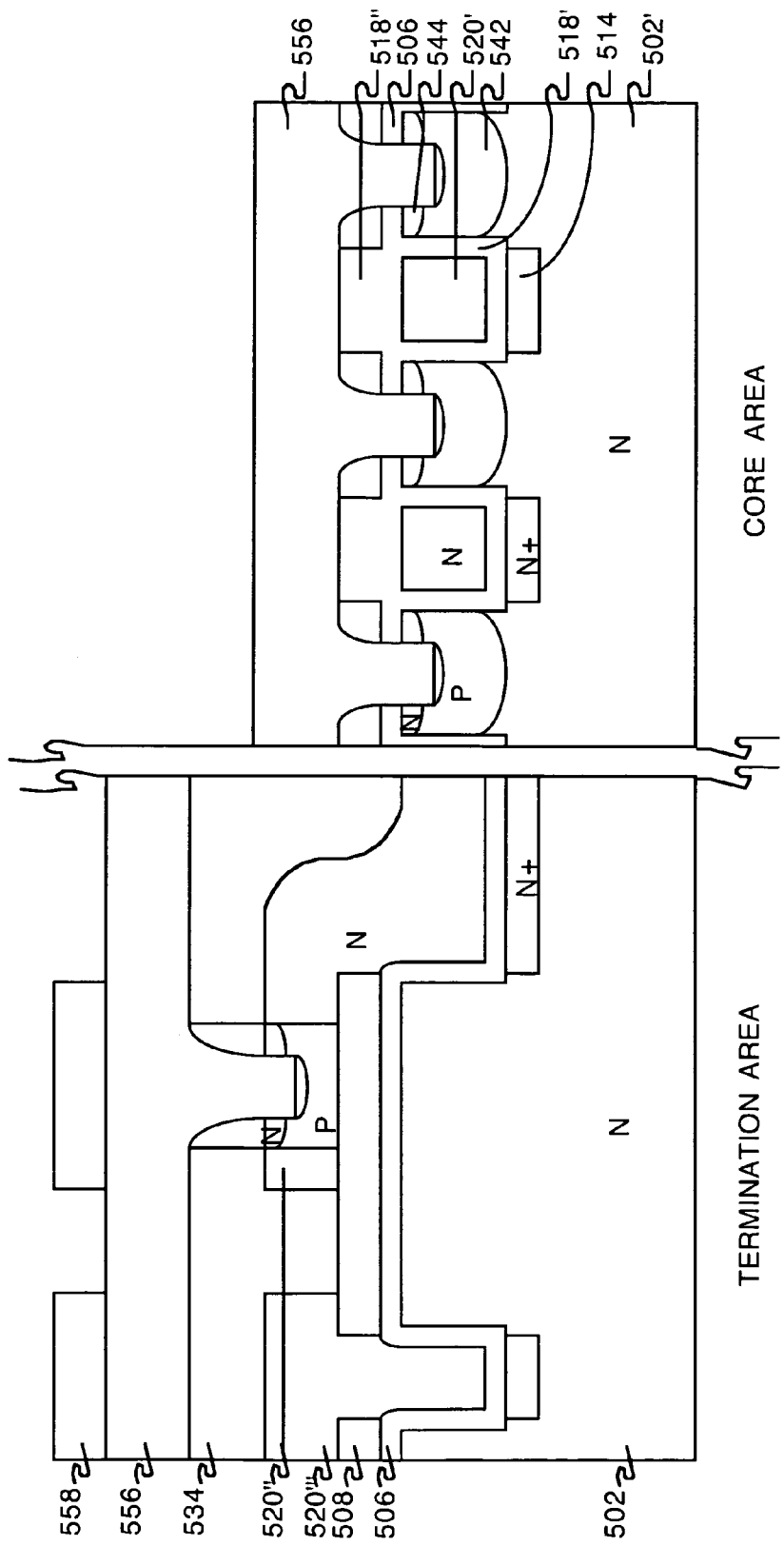

As depicted in FIG. 5H, a first metal layer 556 may be deposited on the surface of the wafer, at 456. In one implementation, the first metal layer 556 is deposited by any well-known method such as sputtering. In the core area, the first metal layer 556 extends down into the source/body contact openings 552 to form an electrical contact with the body regions 542 and source regions 544. The first metal layer 556 also extends down into the gate contact opening 538' to form an electrical contact with the gate interconnect region 520". At 458, a photo-resist may be deposited and pattered by any well-known lithography process to form a fifth patterned resist layer 558.

Figure 5I:
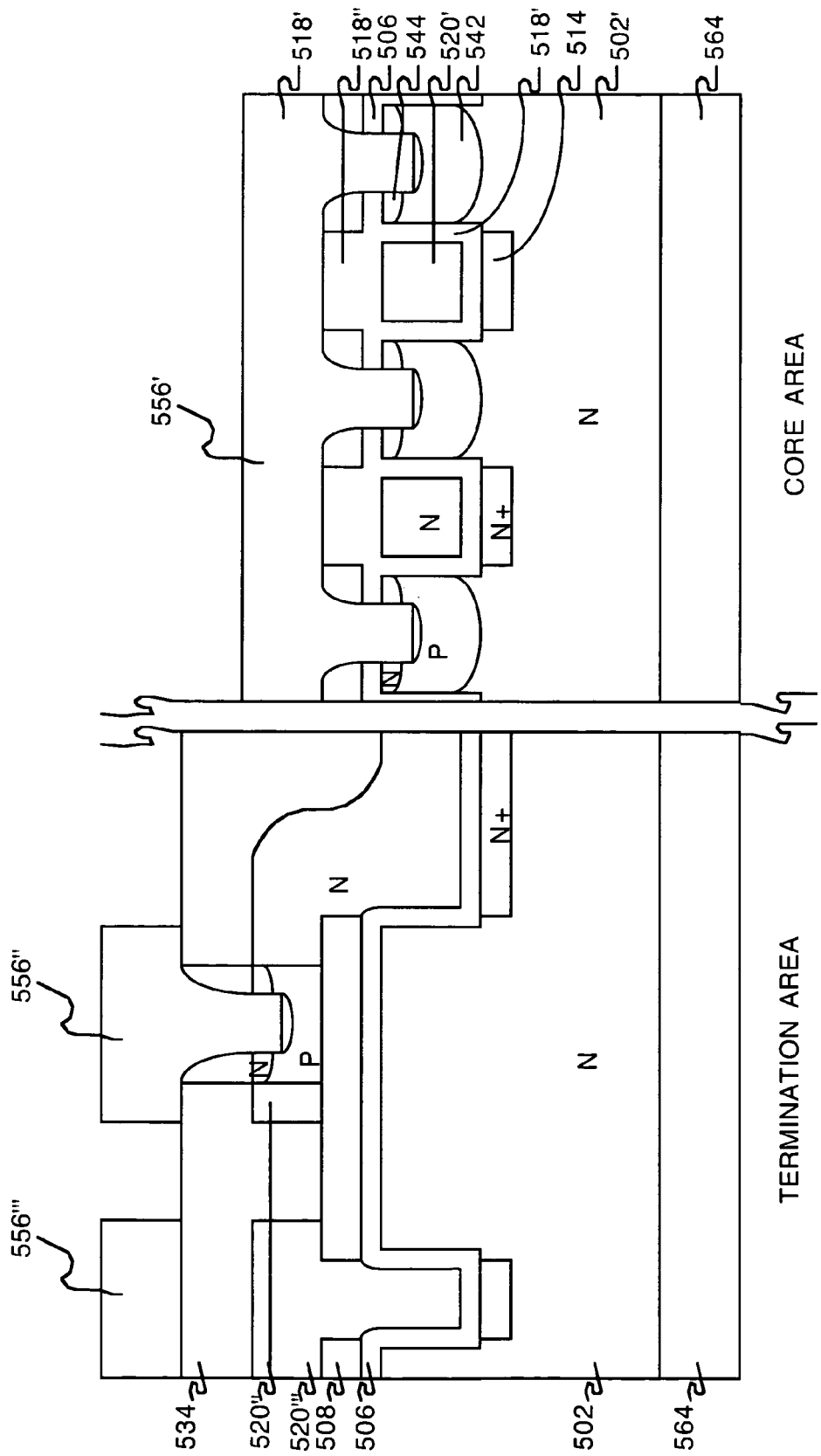

As depicted in FIG. 5I, the first metal layer 556 may be patterned utilizing the fifth patterned resist layer 558 and selective etching method, at 460. The first metal layer 556 is patterned to form a source/body contact 556' and a gate contact 556" as defined by the fifth patterned resist layer 550. The first metal layer 548 may also be patterned to form a second electrode 556'" of the field capacitor. At 462, the fifth patterned resist layer 558 may be removed utilizing an appropriate resist stripper or resist ashing process.

At 464, a second metal layer may be deposited on the backside of the wafer to form a drain contact 564. At 466, fabrication continues with various other processes. The various processes typically include etching, depositing, doping, cleaning, annealing, passivation, cleaving and/or the like.

Although embodiments of the present invention have been described with reference to a striped TMOSFET device, it is appreciated that the invention may also be practiced with closed cell TMOSFETs. In additions, those skilled in the art may readily practice embodiments of the present invention to fabricate insulated gate bipolar transistors (IGBT), MOS controlled thyristors (MCT) or the like semiconductor devices.

Embodiments of the present invention provide a fabrication process that is not limited by the topography of the termination area. The polysilicon layer utilized to form the gate regions is advantageously utilized to form a self-aligned gate interconnect region in the termination area. The self-aligned gate interconnect region enables the use of minimum feature size gate trenches. The gate regions and the gate interconnect region are also advantageously formed without the use of one or more chemical-mechanical polishing processes. Periphery structures such as ESD diodes, temperature cells, field capacitors and the like, may be readily integrated into the polysilicon layer utilized to form the gate region. Furthermore, the gate contact opening is self-aligned with the source and body regions.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method of fabricating a self aligned contact in a semiconductor device comprising:
   etching a trench in a core area and partially extending into a termination area of a substrate;
   growing a first oxide on said substrate proximate a wall and a bottom of said trench;
   depositing a polysilicon layer in said core area and said termination area;
   selectively etching said polysilicon layer to form a gate region in said core area portion of said trench, a first portion of a gate interconnect region in said termination area portion of said trench, and a second portion of said gate interconnect region in said termination area outside of said trench; and
   selectively doping a periphery structure portion of said polysilicon layer in said termination area before said selectively etching said polysilicon layer.

2. The method according to claim 1, further comprising:
   growing a second oxide layer on said substrate prior to said etching said trench; and
   depositing a first nitride layer on said second oxide layer prior to said etching said trench.

3. The method according to claim 2, further comprising:
   depositing a dielectric layer on said selectively etched polysilicon layer and said first nitride layer; and selectively etching said dielectric layer to form a gate insulator region about said gate region and said gate interconnect region from said first oxide layer and said dielectric layer.

4. The method according to claim 3, further comprising:
removing said first nitride layer in said core area after etching-back said dielectric layer;
implanting a body region in an upper portion of said substrate proximate said trench after removing said nitride layer; and
implanting a source region in a portion of said body region proximate said gate region after removing said nitride layer.

5. The method according to claim 4, further comprising:
depositing a second nitride layer after implanting said body region and said source region;
etching a source/body contact opening through said second nitride layer, said source region and a portion of said body region;
etching a gate contact opening through said second nitride layer in said termination area, wherein a portion of said gate interconnect region is exposed;
forming a source/body contact extending down through said source/body contact opening to said source region and said body region in said core area; and
forming a gate contact extending down through said gate contact opening to said second portion of said gate interconnect region in said termination area.

6. The method according to claim 1, wherein said selectively etching said polysilicon layer comprises forming said periphery structure from said polysilicon layer in said termination area.

7. A method of fabricating a trench metal-oxide-semiconductor field effect transistor comprising:
depositing a sacrificial oxide layer on a substrate;
depositing a first nitride layer on said sacrificial oxide layer;
etching a trench through said first nitride layer and said sacrificial oxide layer and into a core area and partially extending into a termination area of said substrate;
growing a first portion of a gate insulator region on said substrate proximate a walls and bottom of said trench to form a first portion of a gate insulator region;
depositing a polysilicon layer in said core area and said termination area including said trench;
etching-back said polysilicon to form a gate region in said core area portion of said trench, a first portion of a gate interconnect region in said termination area portion of said trench, and a second portion of said gate interconnect region in said termination area outside of said trench;
depositing a dielectric layer on said gate region, gate interconnect region and said first nitride layer;
etching-back said dielectric layer to form a second portion of said gate insulator region about said gate region and said gate interconnect region;
removing said first nitride layer in said core area;
implanting a body region in an upper portion of said substrate in said core area proximate said gate region to form a drain region in a lower portion of said substrate in said core area; and
implanting a source region in said body region in said core area proximate said gate region, wherein said source region is separated from said drain region by said body region.

8. The trench metal-oxide-semiconductor field effect transistor according to claim 7, further comprising:

etching a source/body contact opening in said core area and a gate contact opening in said termination area;
forming a source/body contact extending down through said source/body contact opening to said source region and said body region from a first metal layer; and
forming a gate contact extending down through said gate contact opening to said gate interconnect region from said second metal layer.

9. The method according to claim 8, wherein:
said etching said trench further forms a periphery trench in said termination area;
said etching-back said polysilicon layer further forms a first electrode of a field capacitor in said periphery trench; and further comprising
forming a second electrode of said field capacitor from said first metal layer when forming said source/body contact and said gate contact.

10. The method according to claim 7, further comprising selectively implanting said substrate proximate said bottom of said trench before said depositing said polysilicon layer.

11. The method according to claim 7, further comprising
implanting a portion of said polysilicon layer in said termination area to form a diode in a portion of said gate interconnect region.

12. The method according to claim 7, wherein said etching-back said polysilicon layer further forms a temperature cell in said termination area.

13. A method of fabricating a self aligned contact in a semiconductor device comprising:
etching a trench in a core area and partially extending into a termination area of a substrate;
growing a first oxide on said substrate proximate a wall and a bottom of said trench;
depositing a polysilicon layer in said core area and said termination area;
selectively etching said polysilicon layer to form a gate region in said core area portion of said trench, a first portion of a gate interconnect region in said termination area portion of said trench, and a second portion of said gate interconnect region in said termination area outside of said trench;
implanting a body region in a portion of said substrate in said core area proximate said gate region; and
implanting a source region in a portion of said body region in said core area proximate said gate region gate region.

14. The method according to claim 13, further comprising:
depositing a dielectric layer on said selectively etched polysilicon layer and said first nitride layer; and
selectively etching said dielectric layer to form a gate insulator region about said gate region and said gate interconnect region from said first oxide layer and said dielectric layer.

15. The method according to claim 14, further comprising:
growing a second oxide layer on said substrate prior to said etching said trench; and
depositing a first nitride layer on said second oxide layer prior to said etching said trench.

16. The method according to claim 15, further comprising:
removing said first nitride layer in said core area after etching-back said dielectric layer;
implanting said body region after removing said nitride layer; and
implanting said source region after removing said nitride layer.

17. The method according to claim 16, further comprising:
depositing a second nitride layer after implanting said body region and said source region;

etching a source/body contact opening through said second nitride layer, said source region and a portion of said body region;
etching a gate contact opening through said second nitride layer in said termination area, wherein a portion of said gate interconnect region is exposed;
forming a source/body contact extending down through said source/body contact opening to said source region and said body region in said core area; and
forming a gate contact extending down through said gate contact opening to said second portion of said gate interconnect region in said termination area.

18. The method according to claim 17, further comprising:
forming a periphery structure from said polysilicon layer in said termination area by said selectively etching said polysilicon layer; and
selectively doping said periphery structure portion of said polysilicon layer in said termination area before said selectively etching said polysilicon layer.

* * * * *